US006749442B2

United States Patent

Matsuo

(10) Patent No.: US 6,749,442 B2
(45) Date of Patent: Jun. 15, 2004

(54) FLEXIBLE CIRCUIT BOARD CONNECTING DEVICE

(75) Inventor: Tsutomu Matsuo, Tokyo (JP)

(73) Assignee: Hirose Electric Co., Ltd., Tokyo (JP)

(*) Notice: Subject to any disclaimer, the term of this patent is extended or adjusted under 35 U.S.C. 154(b) by 0 days.

(21) Appl. No.: 10/270,044

(22) Filed: Oct. 15, 2002

(65) Prior Publication Data

US 2003/0077923 A1 Apr. 24, 2003

(30) Foreign Application Priority Data

Oct. 18, 2001 (JP) ....................................... 2001-321043

(51) Int. Cl.[7] ........................... H01R 12/00; H05K 1/00

(52) U.S. Cl. ............................ 439/67; 439/77; 439/342

(58) Field of Search ............................ 439/67, 77, 342, 439/495, 857

(56) References Cited

U.S. PATENT DOCUMENTS

| | | | | |
|---|---|---|---|---|
| 5,744,759 A | * | 4/1998 | Ameen et al. | 174/260 |
| 5,873,740 A | * | 2/1999 | Alcoe et al. | 439/67 |
| 5,953,214 A | * | 9/1999 | Dranchak et al. | 361/767 |
| 6,083,022 A | * | 7/2000 | Walkup | 439/260 |
| 6,347,946 B1 | * | 2/2002 | Trobough et al. | 439/70 |
| 6,558,170 B1 | * | 5/2003 | Lemke | 439/83 |
| 2002/0102869 A1 | * | 8/2002 | Ali et al. | 439/66 |

FOREIGN PATENT DOCUMENTS

| | | |
|---|---|---|
| JP | 3-182075 | 8/1991 |
| JP | 8-227745 | 9/1996 |
| JP | 8-255961 | 10/1996 |

* cited by examiner

*Primary Examiner*—Hae Moon Hyeon
(74) *Attorney, Agent, or Firm*—Kanesaka & Takeuchi

(57) ABSTRACT

A flexible circuit board connecting device comprises a flat connector (10) to be connected to a predetermined circuit member, a flexible circuit board (1) to be connected to the circuit member via the connector (10). The connector (10) comprises a flat housing having a plurality of holding holes (12), a plurality of terminals (14) held in the holding holes (12). Each terminal (14) has a connection section (14A) to be connected to the circuit board and a contact section (14D) to be connected to the flexible circuit board. The contact points between the flexible circuit board and the terminals are made movable along the flexible circuit board from the zero insertion position to the contact position under spring forces.

6 Claims, 4 Drawing Sheets

FLEXIBLE CIRCUIT BOARD CONNECTING DEVICE

BACKGROUND OF THE INVENTION

1. Field of the Invention

The present invention relates to a technology of an electrical connector, particularly, to a mechanism to connect a flexible circuit board to a connector.

2. Description of the Related Art

A flexible circuit board is comprised of a flexible board, wirings provided on the flexible board and connection pads to be conductive through wirings, which are provided on the edge of the flexible board. When the flexible circuit board is used, it is placed onto a flat type connector, and then pressed and held, so that the connection pads contact with corresponding terminals of the connector. Such connection structure is known, for example, by disclosures in Japanese Unexamined Patent Publications Nos. 8-255961, 8-227745 and 3-182075.

In this type of connectors, the flexible circuit board or the connector has a flat connecting section (e.g. connection pad), and the other, the one between the flexible board and the connector which does not have the flat connect section, has a protruding elastic contact section. By putting in place and then pressing the flexible circuit board and the connector, such that the protruding elastic contact section is pressed to/into the flat contact section, the connection between the flexible circuit board and the connector is achieved and maintained. Therefore, the connection is achieved without an inserting force for engagement, such as the one required for the connection of terminals of normal connector. Also, since the terminals are arranged in columns and rows in those methods, the contact points to prevent the inserting force from becoming too large.

In such publicly known devices, a pressuring member is used to press the flexible circuit board towards the connector. According to the mechanism of the pressuring member, it is difficult to press the whole area of the connecting section of the flexible circuit board by the pressuring member to connect with the connector. Therefore, the pressuring member merely presses locally, for example, on both edges.

Since the flexible circuit board is flexible itself, it causes a distortion, such as deflection or torsion, if it is locally pressed. In other words, the connecting pressure is not uniformly applied to an area of the connecting section, which causes poor connection or the like, so that its electrical properties become unstable. Those problems are more conspicuously observed for flexible circuit boards having a large number of connection pads (contact points).

SUMMARY OF THE INVENTION

Accordingly, it is an object of the present invention to provide a structure for the connection of the flexible circuit board, which enables uniform and stable connection without such problems even when the flexible circuit board has a large number of contact points.

According to the present invention there is provided the flexible circuit board connecting device comprises a flat-type connector to connect with a specified circuit member and a flexible circuit board to connect with the circuit member via the connector.

In the flexible circuit board connecting device according to the present invention, the connector holds a plurality of terminals in holding holes of a housing, and each terminal has a connecting section on one side of the housing to connect with a circuit board and a contact section on the other side to contact with the flexible circuit board. The contact section between flexible circuit and the terminal can move opposing each other in a direction parallel to the surface of the flexible circuit board from specified zero inserting force position, where the flexible circuit board and the connector are contacted over the surface by zero inserting force, to a contact position, where the flexible circuit board and the connector are contacted under elastic pressure.

According to the present invention, the flexible circuit board is brought to a position, where its contact portion is close to the contact position of the corresponding terminal, by zero inserting force, and then moved in a direction of the surface, so that the contact portion comes to contact with the contact section under an elastic pressure. Each contact portion and its corresponding contact section simultaneously contact under the same condition, so that all the contact portions and their corresponding sections can evenly be contacted without uneven contact due to the flexibility of the flexible circuit board.

In an embodiment of the present invention, the device is made as follows. The contact section of the connector is formed on an elastic arm, which protrudes from the other side of the housing and extends along the surface. A window is provided to the housing for receiving the elastic arm at the zero inserting force position, and a connection pad is provided near the window. The contact portion is contacted with the connection pad under an elastic pressure at the time of relative movement towards the contact position.

In this case, the terminal of the connector is made to have another arm to tightly press the flexible circuit board by moving in concert with the elastic arm. By doing this, the contact between the flexible circuit board and the connector is further ensured. In this embodiment, the connecting pad and the window of the flexible circuit board and their corresponding terminals are arranged in columns and rows so that the number of the contact points can be increased.

In another embodiment of the present invention, the flexible circuit board is made as follows. The flexible circuit board has a contact pin to connect with the terminal of the connector, which is provided so as to protrude from the surface of the flexible circuit board towards the connector. The contact pin is put into the holding hole of the connector at the zero inserting force position, and contacts with the contact section of the terminal under an elastic pressure through the movement of the flexible circuit board towards the contact position.

In this case, the terminal of the connector is made such that the contact section tightly presses the contact pin so that the contact can be further ensured. Even in this embodiment, each contact pin of the flexible circuit board and its corresponding terminal of the connector are arranged in columns and in rows, so that the number of the contact points can be increased. The embodiments of the present invention are described below, particularly referring to the accompanying figures, FIGS. 1 through 4.

DESCRIPTION OF THE PREFERRED EMBODIMENTS

First Embodiment

Figure 1:
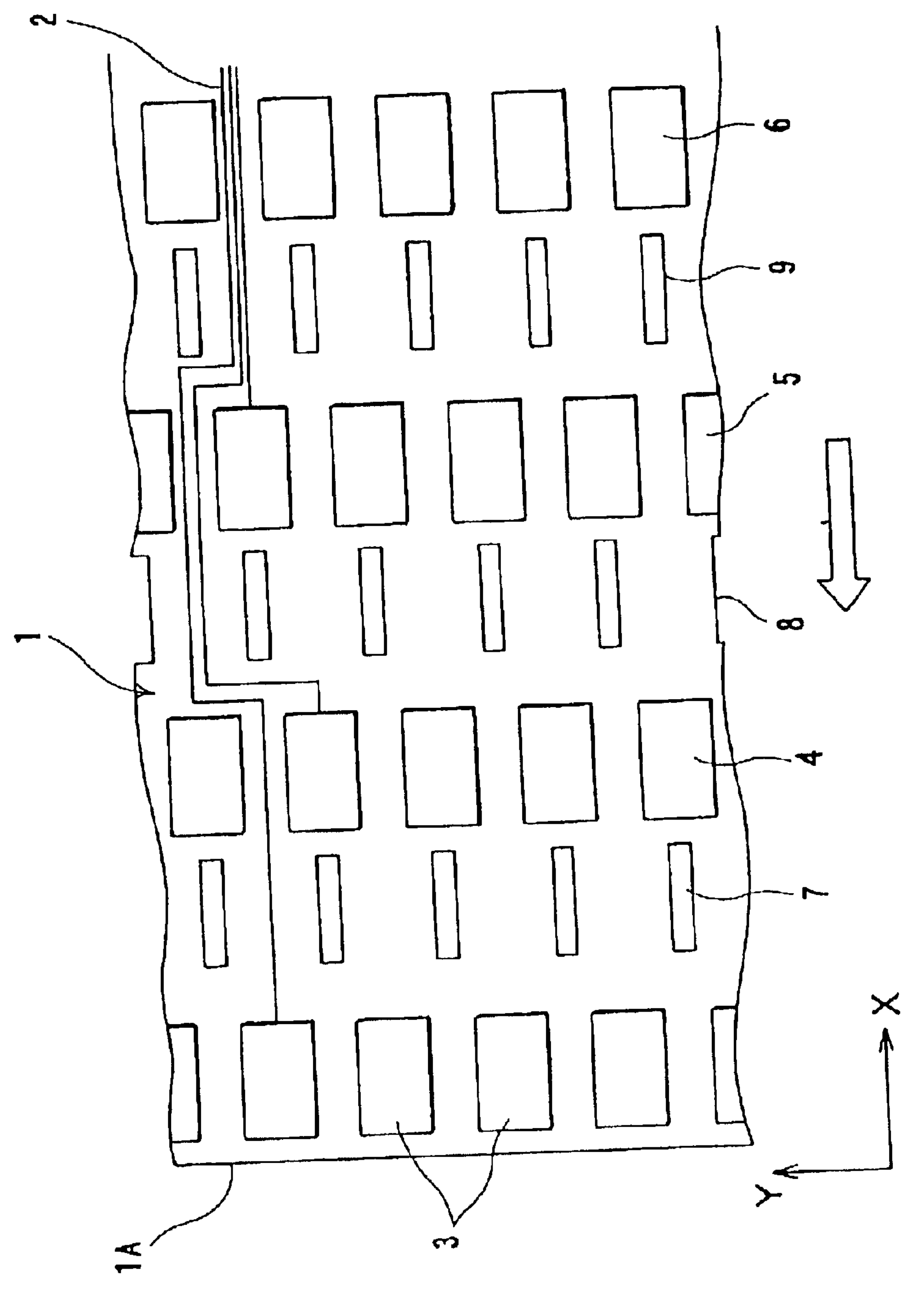
FIG. 1 is a top plan view of the flexible circuit board according to the first embodiment of the present invention.

In FIG. 1, the flexible circuit board 1, which is on an XY plane, has a cable band having wirings 2 extending in the right direction (X direction). The flexible circuit board 1 has a plurality of first connection pads 3 provided in rows along Y direction, which is parallel to a front edge (an edge extending along Y direction at left edge of the flexible circuit board), with a certain pitch interval in proximity to the front edge 1A. Here, each first connection pad is comprised of an electrically conductive layer. The rows of pads, such as rows of second connection pads, third connection pads and fourth connection pads, are successively provided in similar manner to the first connection pads. The connection pads 4, 6 are arranged in the positions shifted for half pitch from the position of the connection pads 3, 5 respectively.

Long and narrow windows 7, 8, 9 are provided left of the connection pads 4, 5, 6 respectively. The interval between each connection pad and the window is substantially equal to the distance between the first connection pads 3 on the front row and the front edge of the flexible circuit board. The wirings 2 extend rightward from each connection pad in respective row of connection pads 3, 4, 5, 6 in a manner not to interfere with the windows and the other pads. Since the wirings 2 are more densely arranged in right side, it can be suggested to arrange the wirings in multiple layers, where the insulating layer is placed between the wirings, so that the wirings would not be unnecessarily too densely arranged. In this embodiment, the connection pads 3, 4, 5, 6 and their wirings are provided on both surfaces of the flexible circuit board, as illustrated in FIG. 2, but it is not limited to this, and they can be provided only on one surface, for example only on the upper surface of the flexible circuit board.

On the other hand, the connector 10 is also on XY plane corresponding to the flexible circuit board. As illustrated in FIG. 2, the connector 10 is comprised of a flat housing 11. Here, the holding hole 12 goes through the housing and a long and narrow holding slot 13 is provided on the upper surface of the housing and links to the holding hole 12. The terminal 14 is prepared by punching a metal sheet maintaining its flat surface parallel to the surface of the paper of the figure, and pressed into the holding hole 12. As illustrated in FIG. 2, the terminal 14 has a fixing section 14A, which is the connection section to be pressed into the holding hole 12, a holding arm 14B, which defines the position to press in and is held by the holding slot 13, and an elastic arm 14C extending parallel to the holding arm 14B. The protruding contact sections 14D, 14E are formed at front ends of the elastic arm 14C and the holding arm 14B, respectively. The terminal 14 are provided corresponding to connection pads 3, 4, 5, 6 of the flexible circuit board 1, and the elastic arm 14C has such thickness and length as to link through the windows 7, 8, 9 of the flexible circuit board 1 when the windows 7, 8, 9 are placed onto the corresponding terminals. The terminal has a sphere-shaped solder ball, which is provided at the lower end of the fixing section 14A, and protrudes from the lower surface of the housing 11.

In this embodiment, the connector is connected to the flexible circuit board according to the following steps.

(1) First, connect the connector 10 to a specified connecting member such as a circuit board (not shown). The connection between the connector 10 and the circuit board is achieved by placing the connector 10 onto a specific position on the circuit board, and then connecting the terminal 14 and the corresponding circuit section via soldering by melting the solder ball 15 with hot air or the like.

Figure 2A:
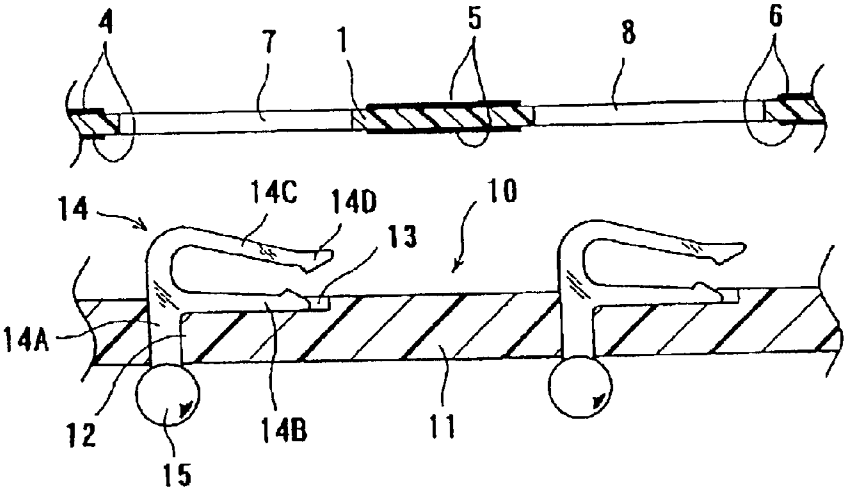
FIGS. 2(A), (B), and (C) are sectional views of the connector in the first embodiment, illustrating the flow of the connecting process.
Figure 2B:
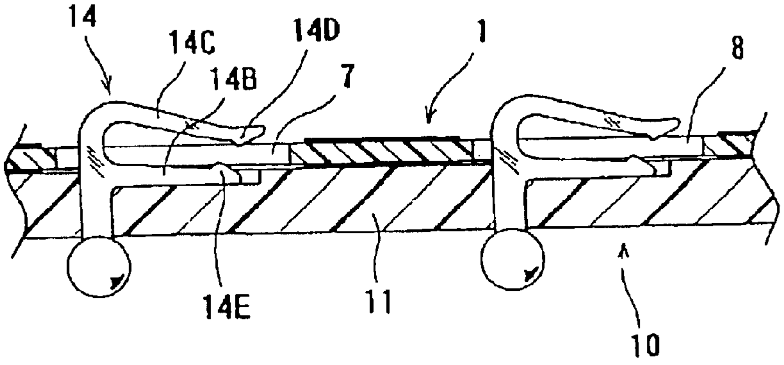
Figure 2C:
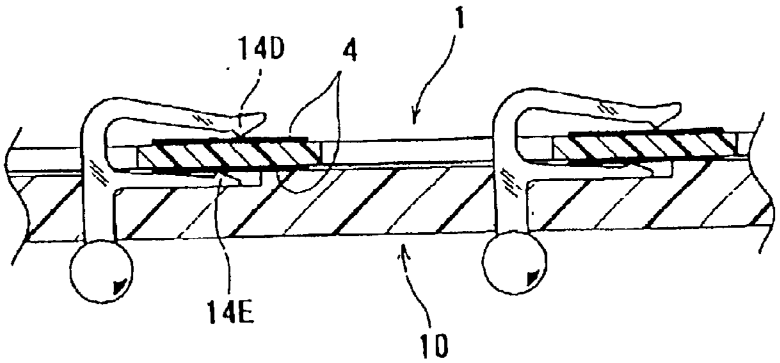

(2) As illustrated in FIG. 2(A), bring the flexible circuit board 1 over to the corresponding position on the upper side of the connector 10.

(3) In next, place the flexible circuit board onto the connector 10, such that they contact each other over the surface. The elastic arm 14C of the terminal 14 protrude from the corresponding windows 7, 8, 9 without any resistance (See FIG. 2(B)).

(4) Thereafter, move the flexible circuit board 1 leftward. The contact section 14D provided at front end of the elastic arm 14 moves onto the front edge 1A of the flexible circuit board 1 and then onto the edge of each window 7, 8, 9. After that, the contact section 14D moves onto the corresponding connection pad 3, 4, 5, 6. By doing this, the contact sections 14D, 14E contact with the connection pads 3, 4, 5, 6 by elastic pressure, in a manner that the connection pads are tightly pressed by the elastic recovery force of the elastic arm 14.

Second Embodiment

The second embodiment is described below with respect to FIGS. 3 and 4. In this embodiment, the flexible circuit board 1 does not have the window as in the previous embodiment, but has a plurality of contact pins 21. The electrically conductive layers 22 are formed on the flexible circuit board 1, corresponding to the positions of the connection pads. The electrically conductive layers 22 are provided around holes for inserting the contact pins 21 on both upper and lower surfaces of the flexible circuit board, and also provided on the inner surfaces of cylindrical portions of the holes, such that the conductive layer is continuously provided around the holes from the upper surface through the lower surface.

Figure 3A:
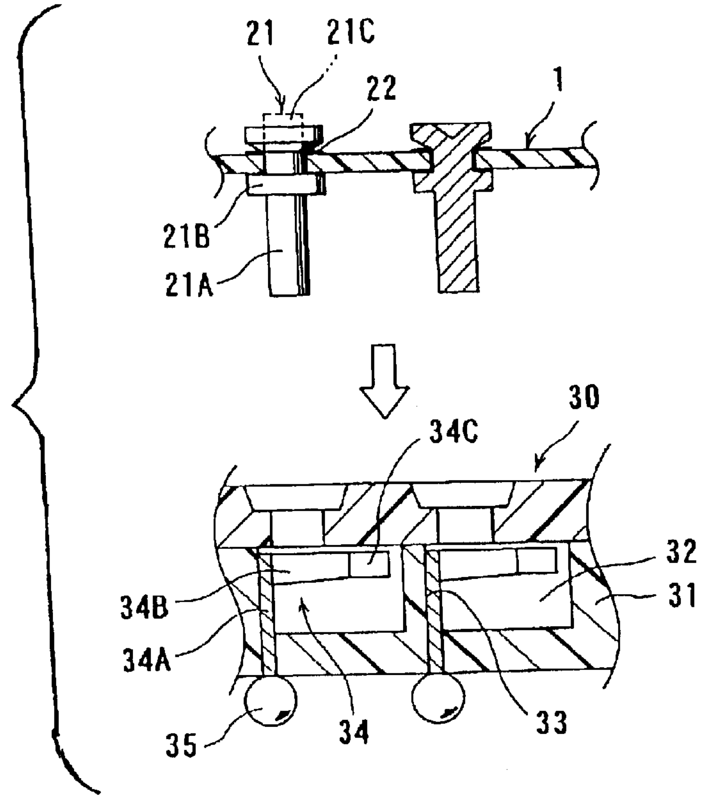
FIGS. 3(A), (B) and (C) are sectional views of the flexible circuit board and the connector in the second embodiment of the invention, illustrating the flow of the connecting process.

The contact pin 21 has a shaft 21A, a flange 21B and a head part 21C having substantially same diameter as that of the shaft 21 (double-dashed line in FIG. 3(A)). To mount the contact pin 21 to the flexible circuit board 1, the protruding head part 21C is inserted through the hole from the bottom. Then, the head part 21C is deformed though plastic deformation so as to shape like a flange (see FIG. 3(A) for its sectional view). That is, the diameter of the head part 21C is broadened by pressing the head part in the axial direction with an appropriate tool.

Figure 3B:
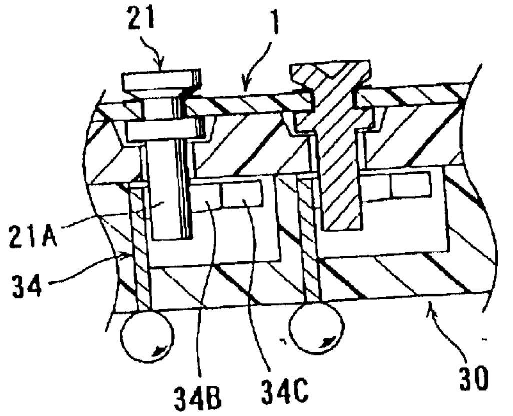
Figure 3C:
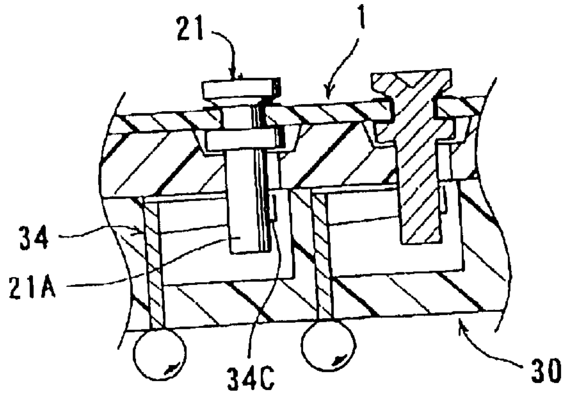

On the other hand, as illustrated in FIG. 3, the connector 30 has a relatively thick flat housing 31 in comparison with the one in the previous embodiment. In this embodiment, the housing 31 has a dent 32 opening upward on its surface and a holding hole 33 which is located at edge of the dent and goes through to the lower surface of the housing.

Figure 4A:
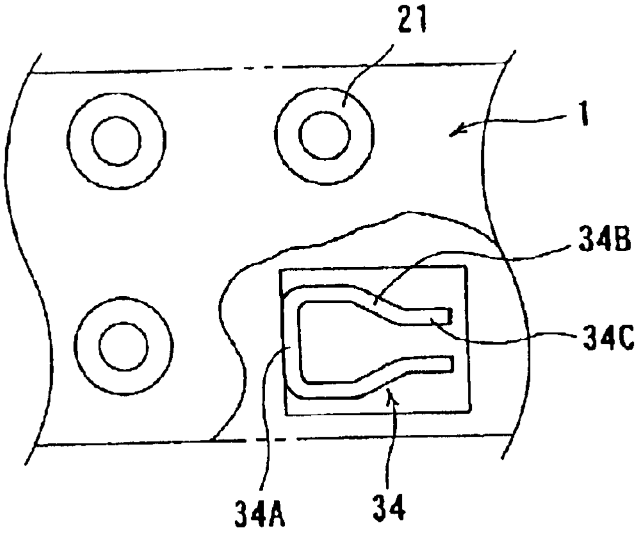
FIGS. 4(A), (B) and (C) are top views of the flexible circuit board and the connector in FIG. 3, illustrating the connecting process.
Figure 4B:
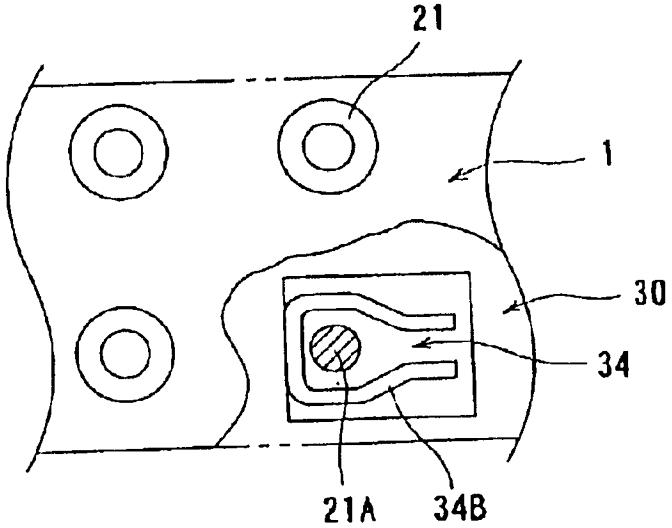
Figure 4C:
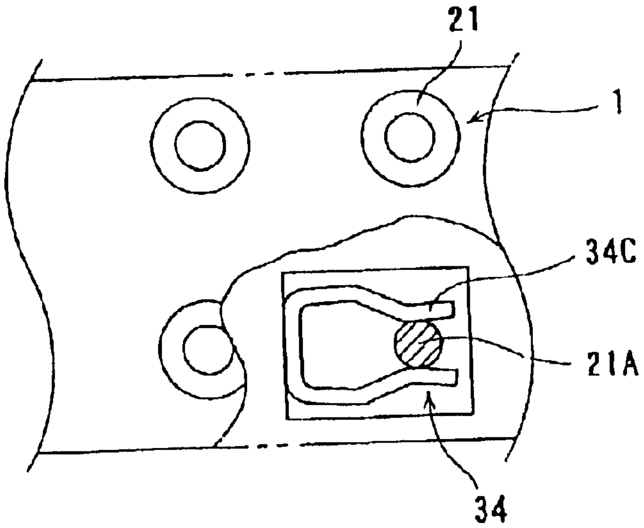

As shown in FIGS. 3 and 4, the terminal 34 has a fixing section 34A, which is a flat type connection section pressed into the holding hole 33, and a U-shape elastic arm piece 34B which consists of two facing arms in the dent 32. The U-shape elastic arm piece 34B is provided at the upper portion of the fixing section 34A, and extends such that the U-shape elastic arm piece is angled from the direction of the fixing section 34A. The distance between the two facing arms of the U-shape elastic arm piece becomes shorter as it goes to the ends (free ends), and the contact section 34C is formed by those free ends. The distance between the two facing arms of the U-shape elastic arm piece 34B is designed such that the contact pin can well fit in, and simultaneously the spacing between the contact sections 34C is designed to be slightly smaller than the diameter of the shaft 21A of the contact pin 21A. Also, a solder ball 35 is provided on the lower end of the fixing section 34A, in a similar manner to that in the previous embodiment.

In this embodiment, to use the device, the terminal 34 is first connected with the specified circuit board using the solder ball 35. Thereafter, as illustrated in FIG. 3(A), the flexible circuit board is brought onto the connector 1, and then the contact pin 21 mounted to the flexible circuit board 1 is inserted with zero inserting force into the area on the connector, where the distance between the two facing arms of the U-shape arm piece 34B is large (see FIGS. 3(A) and 4(B)). Then, the flexible circuit board is moved in a direction parallel to its surface, so that the contact pin 21 is pushed into the contact section 34C and the connection between the flexible circuit board and the connector is completed.

As described above, in the present invention, each terminal of the connector and its corresponding portion of the flexible circuit board are made to elastically contact simply by inserting the flexible circuit board with zero inserting force into a position very close to the connection section and then by relatively moving the flexible circuit board parallel to its surfaces. Therefore, the problem of uneven pressure over the contacting surface due to local application of pressure onto the flexible circuit board is solved, and same pressure is equally applied to any portion over the surface. Accordingly, the device of the present invention is very effective, especially when many terminals are arranged in lines and rows.

What is claimed is:

1. A flexible circuit board connecting device, comprising:

a connector to connect with a predetermined circuit member;

a flexible circuit board to connect with said circuit member via said connector; wherein said connector comprises:

a housing;

a plurality of holding holes provided in said housing; and a plurality of terminals held in said holding holes of said flat housing, said terminals each having a connection section on one side of said housing to connect with said circuit member and a contact section on the other side of said housing to contact with said flexible circuit board, wherein said flexible circuit board and said contact section of said terminal are movable opposing each other in a direction parallel to a surface of said flexible circuit board from a zero inserting force position, where said flexible circuit board contacts said connector over its surface with zero inserting force, to a contact position, where said flexible circuit board contacts said connector under pressure;

an elastic arm protruding from the other side of said housing of said connector and extending along said other surface;

a window formed in said flexible circuit board to receive said elastic arm at said zero inserting force position; and a connection pad provided on a surface near said window, wherein said contact section of said connector is provided on said elastic arm, and said contact section elastically contacts with said connection pad when said flexible circuit board is moved relatively to said contact position.

2. A flexible circuit board connecting device according to claim 1, wherein said terminal has another arm provided to tightly press said flexible circuit board by moving in concert with said elastic arm.

3. A flexible circuit board connecting device according to claim 1, wherein said connection pad, window and their corresponding terminal of said connector are arranged in columns and rows.

4. A flexible circuit board connecting device according to claim 1, wherein said flexible circuit board has a contact pin protruding from a surface of said flexible circuit board towards said connector to connect with said terminal of said connector, and said contact pin is movable into said holding hole of said connector by said zero inserting force and contacts with said contact section of said terminal by pressure through the movement towards said contact position.

5. A flexible circuit board connecting device according to claim 4, wherein said terminal of said connector is made to tightly press said contact pin.

6. A flexible circuit board connecting device according to claim 4 or 5, wherein said contact pin of said flexible circuit board and its corresponding terminal of said connector are arranged in columns and in row.

* * * * *